United States Patent
Fujii et al.

(10) Patent No.: US 7,539,320 B2
(45) Date of Patent: May 26, 2009

(54) HEARING AID WITH AUTOMATIC EXCESSIVE OUTPUT SOUND CONTROL

(75) Inventors: Shigekiyo Fujii, Kanagawa (JP);
Hiroshi Kondo, Kanagawa (JP);
Yoshiyuki Yoshizumi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 10/568,447

(22) PCT Filed: Aug. 18, 2004

(86) PCT No.: PCT/JP2004/012147
§ 371 (c)(1),
(2), (4) Date: Nov. 15, 2006

(87) PCT Pub. No.: WO2005/018280
PCT Pub. Date: Feb. 24, 2005

(65) Prior Publication Data
US 2007/0058828 A1  Mar. 15, 2007

(30) Foreign Application Priority Data
Aug. 19, 2003  (JP) .............................. 2003-295609

(51) Int. Cl.
*H04R 25/00* (2006.01)
*H03G 3/00* (2006.01)
(52) U.S. Cl. ...................................... 381/312; 381/107
(58) Field of Classification Search ................ 381/23.1, 381/72, 74, 107, 120, 312, 321, 104
See application file for complete search history.

(56) References Cited

U.S. PATENT DOCUMENTS

| | | | | |
|---|---|---|---|---|
| 4,181,818 | A | * | 1/1980 | Shenier ........................ 381/72 |
| 4,479,239 | A | * | 10/1984 | Rhines ........................ 381/72 |
| 4,509,022 | A | | 4/1985 | Ridel |
| 6,151,400 | A | | 11/2000 | Seligman |

FOREIGN PATENT DOCUMENTS

| | | |
|---|---|---|
| JP | 5568069 | 5/1980 |
| JP | 58162115 | 9/1983 |
| JP | 05-083052 | 4/1993 |
| JP | 05-175768 | 7/1993 |
| JP | 10507603 | 7/1998 |
| JP | 2002-368562 | 12/2002 |

OTHER PUBLICATIONS

PCT International Search Report dated Nov. 16, 2004.
Japanese Office Action dated Aug. 1, 2008 with English translation thereof.

* cited by examiner

*Primary Examiner*—Brian Ensey
(74) *Attorney, Agent, or Firm*—Dickinson Wright, PLLC

(57) ABSTRACT

A technique is disclosed, which can shorten attack time and release time without using RC filter with time constant. According to this technique, diodes 51 and 52 rectify AC signal at output stage of an amplifier 30 by voltage doubler rectification, and a smoothing capacitor 53 smoothens the signals rectified by the diodes 51 and 52. A transistor 41 of an attenuation circuit 40 turns on when DC voltage smoothened by the smoothing capacitor exceeds a predetermined level, and level of the output signal of the amplifier is attenuated by drawing the input signal of the amplifier.

7 Claims, 3 Drawing Sheets

HEARING AID WITH AUTOMATIC EXCESSIVE OUTPUT SOUND CONTROL

TECHNICAL FIELD

The present invention relates to a hearing aid for automatically controlling output when impact sound or excessive sound is inputted.

BACKGROUND ART

Before explaining the prior art, description will be given on general features of automatic gain control in a hearing aid. In a hearing aid, it is necessary to change the gain according to the level of the input sound pressure (and not to evenly amplify the input sound). In case of a user, who is accompanied with recruitment phenomenon, it is difficult to hear low sound, while big sound or strong sound can be heard on the same level as a person with normal hearing ability. Thus, it is necessary to increase the degree of amplification when the input sound is low, and to suppress output level without amplifying very much when the input sound is high or strong and to suppress the output level to the range where the user can hear. For instance, when impact sound of shutting a door is inputted and if it is amplified in the same manner as low input sound, the output level gives uncomfortable feeling to the user, and the output level must be suppressed. In case of big or strong sound of conversation is heard, signal level reaches saturation range of the amplifier or the earphone, and the output sound is extremely distorted, and this gives influence on sound quality and hearing of speech sound.

For the purpose of suppressing the impact sound or big or strong sound (excessive sound) at input stage or output stage of the amplifier depending on the signal level, an automatic gain control circuit or a peak clipping circuit is used. In case the peak clipping circuit is used, a limiter is applied on waveform of more than a predetermined level. As a result, harmonic distortion occurs, and this decreases speech sound articulation of consonant. Thus, the automatic gain control circuit is effective. In the automatic gain control, input signal or output signal is monitored, and a signal exceeding a predetermined level is compressed. In this function, setting values for the attack time from the start of the operation and the release time up to the release of the operation are important. When the attack time is long, impulse-like signal such as impact sound cannot be suppressed, and uncomfortable sound is outputted. In case the attack time and the release time are longer, speed sound is heard as if it is rebounded. Thus, in the automatic gain control of a hearing aid, it is effective to control and to shorten the attack time and the release time.

The automatic gain control known in the past is described in the patent reference 1 as described below. Description will be given below on the automatic gain control known in the past. FIG. 3 is a circuit diagram showing an arrangement of an automatic gain control circuit of a hearing aid. In FIG. 3, a sound signal inputted via a microphone 10 is amplified with a certain fixed gain by an amplifier 30 and is outputted to an earphone 100. A variable resistance 140 takes out a part of AC voltage between both ends of the earphone 100. A diode 150 and a capacitor 155 rectify the partial AC voltage between both ends of the earphone 100. Output terminal of RC filter, which comprises a resistance 161 and a capacitor 162, is connected to a base of a first transistor 170. A collector of the first transistor 170 drives the base of a second transistor 180. The second transistor 180 is used to short-circuit the input signal of the amplifier 30 to the grounded side. A battery 80 is used as a power source of this hearing aid. Resistances 230, 240, 250, 260, 270 and 280 are used to determine the level to start compression and to determine input/output characteristics.

Patent Reference 1: Patent Application Publication JP-A-58-162115 (FIG. 1)

Now, description will be given on operation of the automatic gain control circuit with the above arrangement. When a signal between both ends of the variable resistance 140 is increased, the base of the second transistor 180 connected to input terminal of the amplifier 30 is directly driven by the collector of the first transistor 170, and the input signal of the amplifier 30 is short-circuited over a wide range by the second transistor 180. Base voltage of the second transistor 180 is changed depending on signal level at the output stage of the amplifier 30. The signal at the input stage of the amplifier 30 is attenuated, and the function of the automatic gain control is fulfilled.

However, in the automatic gain control circuit known in the past as described above, for the purpose of attaining sufficient effect by RC filter, which comprises a resistance 161 and a capacitor 162, and also for the purpose of following up an impulse-like signal such as impact sound, it is necessary to have longer time constant for RC, while it is difficult to accommodate large RC component in a small housing of a hearing aid. As a result, the impulse-like signal such as impact sound cannot be followed up, and the function of the automatic gain control may not be sufficiently fulfilled.

DISCLOSURE OF THE INVENTION

It is an object of the present invention to provide a hearing aid, which has automatic gain control function to shorten the attack time and the release time so that an impulse-like signal such as impact sound can be followed up.

To attain the above object, the present invention provides a hearing aid, which comprises an amplifier for amplifying an input signal from an input transducer, a plurality of rectifying means for rectifying output signal or input signal of said amplifier, a smoothing capacitor for smoothening direct current rectified by said rectifying means, and an attenuation circuit for attenuating the level of output signal of said amplifier when DC voltage smoothened by the smoothing capacitor exceeds a certain fixed level.

With the arrangement as described above, rectifying means and smoothing capacitor (and not an RC filter with time constant) are used as the means to obtain DC voltage to monitor output signal of the amplifier. As a result, it is possible to shorten the attack time and the release time.

Also, the present invention provides the hearing aid as described above, wherein said attenuation circuit comprises a first transistor, which turns on when DC voltage smoothened by said smoothing capacitor exceeds a certain fixed level and draws the input signal of the amplifier, and there is provided a charging circuit for charging said smoothing capacitor when power turns on.

With the arrangement as described above, pulsating current is generated under the influence of initial charging to the smoothing capacitor when power turns on, and the first transistor of the attenuation circuit repeatedly turns on and off until the smoothing capacitor turns to the charging status, and this makes it possible to prevent the output of a periodic burst sound.

The present invention also provides the hearing aid as described above, wherein there is provided a second transistor to add bias to base of said first transistor; and said first transistor and said second transistor have the same characteristics.

With the arrangement as described above, it is possible to prevent that the operating point of the first transistor of the attenuation circuit is changed due to temperature.

According to the present invention, rectifying means and smoothing capacitor are used instead of RC filter with time constant as the means to obtain DC voltage to monitor the output signal of the amplifier. As a result, the attack time and the release time can be shortened, and it is possible to provide a hearing aid, which can achieve an effect to follow up an impulse-like signal such as impact sound.

One or more objects of the invention may be achieved in whole or in part by a hearing aid with automatic excessive output sound control. The hearing aid has an amplifier for amplifying an input signal from an input transducer, a rectifying circuit for rectifying an output signal of the amplifier, a smoothing capacitor for smoothening direct current rectified by the rectifying circuit, an attenuation circuit for attenuating the level of the output signal of the amplifier when a DC voltage smoothened by the smoothing capacitor exceeds a certain fixed level, and a charging circuit for charging the smoothing capacitor when power turns on. The attenuation circuit has a first transistor that turns on and draws the input signal of the amplifier when the DC voltage smoothened by the smoothing capacitor exceeds the certain fixed level. The hearing aid may further include a second transistor, having the same characteristics as the first transistor, to add bias to the base of said first transistor. Also, the rectifying circuit may have a plurality of diodes and carry out a voltage doubler rectification.

One or more objects of the invention may also be achieved in whole or in part by an alternative hearing aid with automatic excessive output sound control. This hearing aid has an amplifier for amplifying an input signal from an input transducer, a rectifying circuit for rectifying an output signal of the amplifier, a smoothing capacitor for smoothing direct current rectified by the rectifying circuit, and an attenuation circuit for attenuating the level of the output signal of the amplifier when DC voltage smoothed by the smoothing capacitor exceeds a certain fixed level. The attenuation circuit includes a variable resistance and a first transistor. The variable resistance determines a signal suppression amount applied to the input stage of the amplifier, and the first transistor turns on and draws the input signal of the amplifier when the DC voltage smoothened by the smoothing capacitor exceeds the certain fixed level. The hearing aid may further include a charging circuit for charging the smoothing capacitor when power turns on. The hearing aid may also include a second transistor, having the same characteristics as the first transistor, to add bias to the base of the first transistor. Also, the rectifying circuit may have a plurality of diodes and carry out a voltage doubler rectification.

BEST MODE FOR CARRYING OUT THE INVENTION

1st Embodiment

Figure 1:
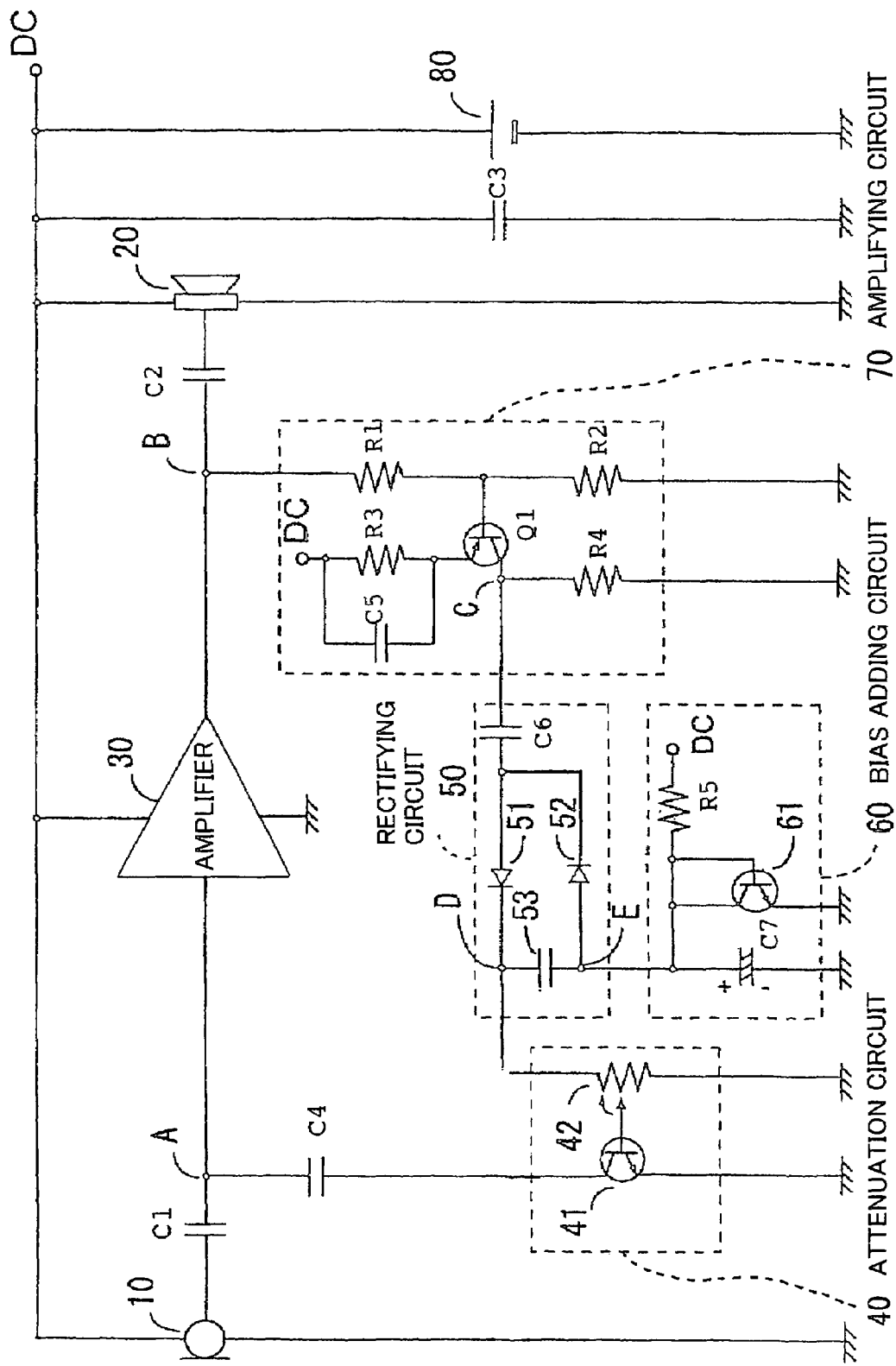
FIG. 1 is a circuit diagram of a hearing aid in a first embodiment of the present invention.

Description will be given below on embodiments of the present invention referring to the attached drawings. FIG. 1 is a circuit diagram showing an arrangement of a hearing aid in a first embodiment of the present invention. In FIG. 1, an impulse-like input signal such as excessive sound or voice or impact sound inputted through a microphone 10, i.e. an input transducer, is applied to an amplifier 30 via a capacitor C1. Then, the sound is amplified with a certain fixed gain and is outputted to an earphone 20, i.e. a receiver with a class D amplifier, via a capacitor C2. DC power is supplied to the microphone 10, the amplifier 30, and the earphone 20 via a battery 80 (and a capacitor C3). An output signal (a connection point B) of the amplifier 30 is monitored by an amplifying circuit 70 and a rectifying circuit 50, and an input signal (a connection point A) of the amplifier 30 is attenuated by a bias adding circuit 60 and an attenuation circuit 40 so that the output signal does not become excessive.

At the amplifying circuit 70, the connection point B (output of the amplifier 30) is grounded via potential resistances R1 and R2, and connection points of the potential resistances R1 and R2 are connected to a base of a transistor Q1. DC power is applied to an emitter of the transistor Q1 via a parallel circuit of a resistance R3 and a capacitor C5. Collector (a connection point C) of the transistor Q1 is grounded via a resistance R4 and is connected to one end of a capacitor C6 on the rectifying circuit 50. The amplifying circuit 70 amplifies output signal of the amplifier 30 and outputs it to the rectifying circuit 50.

At the rectifying circuit 50, the other end of the capacitor C6 is connected to an anode of a diode 51 and to a cathode of a diode 52, serving as rectifying means. Also, a cathode of the diode 51 is connected to one end of a smoothing capacitor 53 (a connection point D), and an anode of the diode 52 is connected to the other end (a connection point E) of the smoothing capacitor 53. At the rectifying circuit 50, the diodes 51 and 52 rectify AC signal at output stage of the amplifier 3 by voltage doubler rectification. When the signals rectified by the diodes 51 and 52 are smoothened by the smoothing capacitor 53, AC voltage amplified by the amplifying circuit 70 is converted to DC voltage.

At the bias adding circuit 60, DC power is applied on one end of a resistance R5. The other end of the resistance R5 is connected to base and collector of a transistor 61 (a second transistor) and to one end of a capacitor C7 and the other end (the connection point E) of the smoothing capacitor 53. The emitter of the transistor 61 and the other end of the capacitor C7 are both grounded. At the attenuation circuit 40, one end (the connection point D) of the smoothing capacitor 53 is connected to one end of a variable resistance 42, and the other end of the variable resistance 42 is grounded. Voltage divided by the variable resistance 42 is applied to a base of the transistor 41 (a first transistor). A collector of the transistor 41 is connected to the connection point A (input of the amplifier 30) via the capacitor C4. The emitter of the transistor 41 is grounded.

The variable resistance 42 at the attenuation circuit 40 determines signal suppression amount to input stage of the amplifier 30, and it is to determine a knee point, i.e. an input level where compression is started, and input/output characteristics. The transistor 41 takes the signals from input stage of the amplifier 30 depending on the signal level at the output stage of the amplifier 30. The bias adding circuit 60 is to operate the transistor 41. The transistor 61 gives bias on the signal, which has been rectified by the diodes 51 and 52 and the smoothing capacitor 53. Its characteristics are the same as that of the transistor 41.

Now, description will be given on operation of the hearing aid with the arrangement as described above, referring to FIG. 1. First, input sound to the microphone 10 is applied to the amplifier 30 and the transistor 41. Output from the amplifier 30 is applied to the earphone 20 and the amplifying circuit 70. The AC signal applied to the amplifying circuit 70 is rectified by the diodes 51 and 52 and smoothened by the smoothing capacitor 53 and is converted to a DC voltage. This DC voltage is added to the bias voltage given by the transistor 61, and the resultant voltage becomes a base voltage of the transistor 41. The transistor 41 is operated when the base voltage of the transistor 41 exceeds threshold value determined by the variable resistance 42. The signal of the input stage of the amplifier 30 is drawn in and is attenuated, and output of the earphone 20 is also suppressed. RC filter with time constant is not used in a signal line within the automatic gain control circuit, and the response from the signal input up to the starting of suppression is quick. In case the input signal is small, the base voltage of the transistor 41 does not exceed the threshold determined by the variable resistance 42. Thus, input signal of the amplifier 30 is not attenuated, and no influence is exerted on the output of the earphone 20.

In this circuit, it is important that variation of the signal level at the output stage of the amplifier 30 is directly reflected to variation of the base potential of the transistor 41. Because base-emitter voltage of the transistor 41 has temperature characteristics, operation-starting point of the transistor 41 changes according to temperature in case the bias applied to the base of transistor 41 is at a constant level. Therefore, to solve this problem, temperature variation of the base-emitter voltage of the transistor 41 is offset through the bias with temperature characteristics by using a transistor 61, which has the same type number, i.e. the same characteristics, as the transistor 41. DC voltage smoothened by the smoothing capacitor 53 is added to this bias, and the variation of the base voltage of the transistor 41, i.e. the amount of the signal drawn from the input stage of the amplifier 30, can be determined in response to the variation of signal level at the output stage of the amplifier 30 without depending on temperature change.

As described above, according to the first embodiment, rectification by the diodes 51 and 52 and smoothening by the smoothing capacitor 53 are used (and not RC filter with time constant) as the means to obtain DC voltage to monitor the output signal of the amplifier 30 by the operation of the transistor 41. As a result, attack time and release time can be made shorter, and an impulse-like signal such as impact sound can be followed up. Further, when the signal at the output stage of the amplifier 30 is increased, the signal level at the input stage of the amplifier 30 is suppressed. As a result, allowance (flexibility) to saturation level of the amplifier 30 is increased, and allowance to saturation level of the earphone 20 is also increased. Thus, it is possible to output a sound, which is less distorted and is natural.

2nd Embodiment

Figure 2:
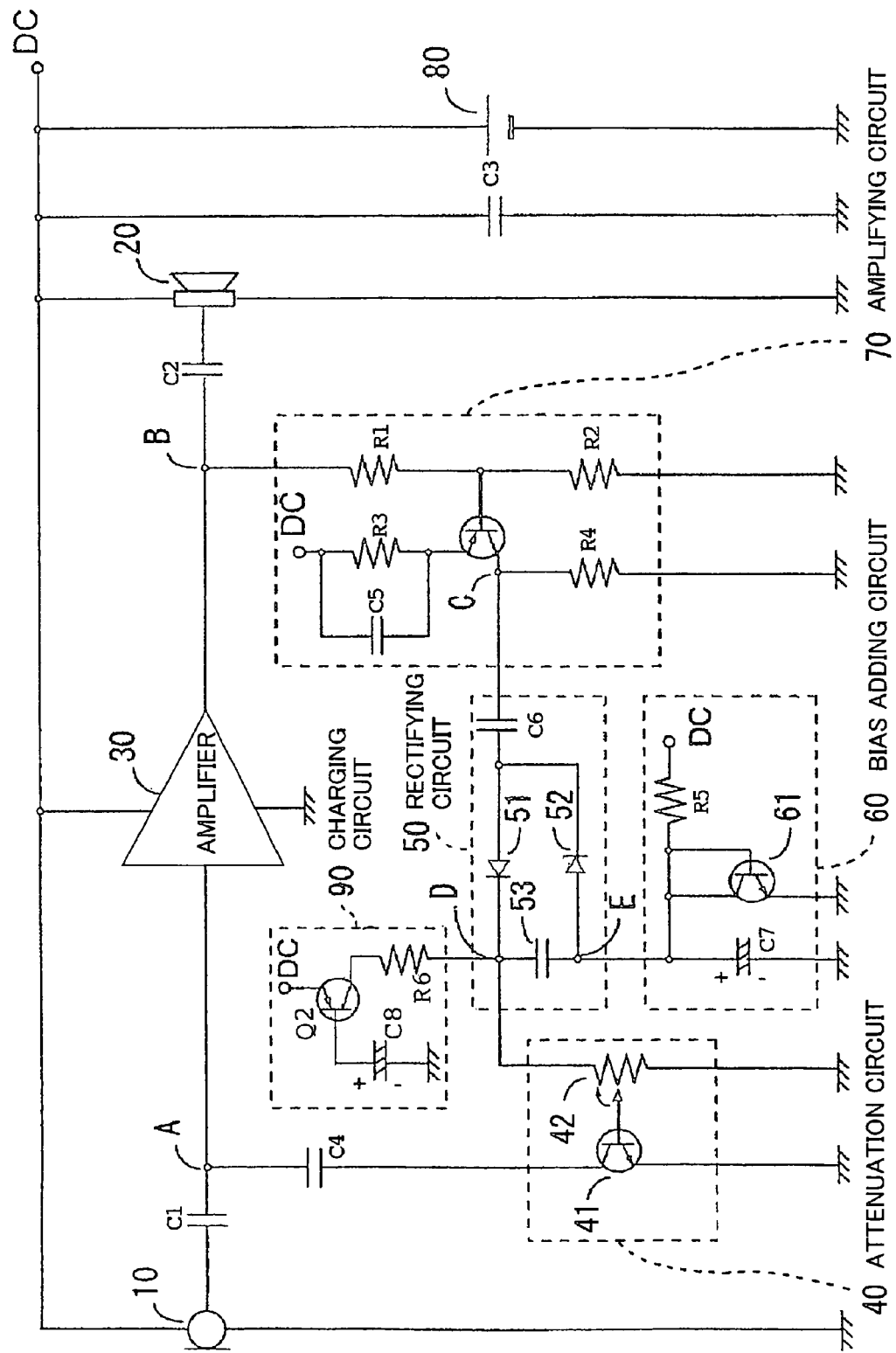
FIG. 2 is a circuit diagram of a hearing aid in a second embodiment of the present invention.
Figure 3:
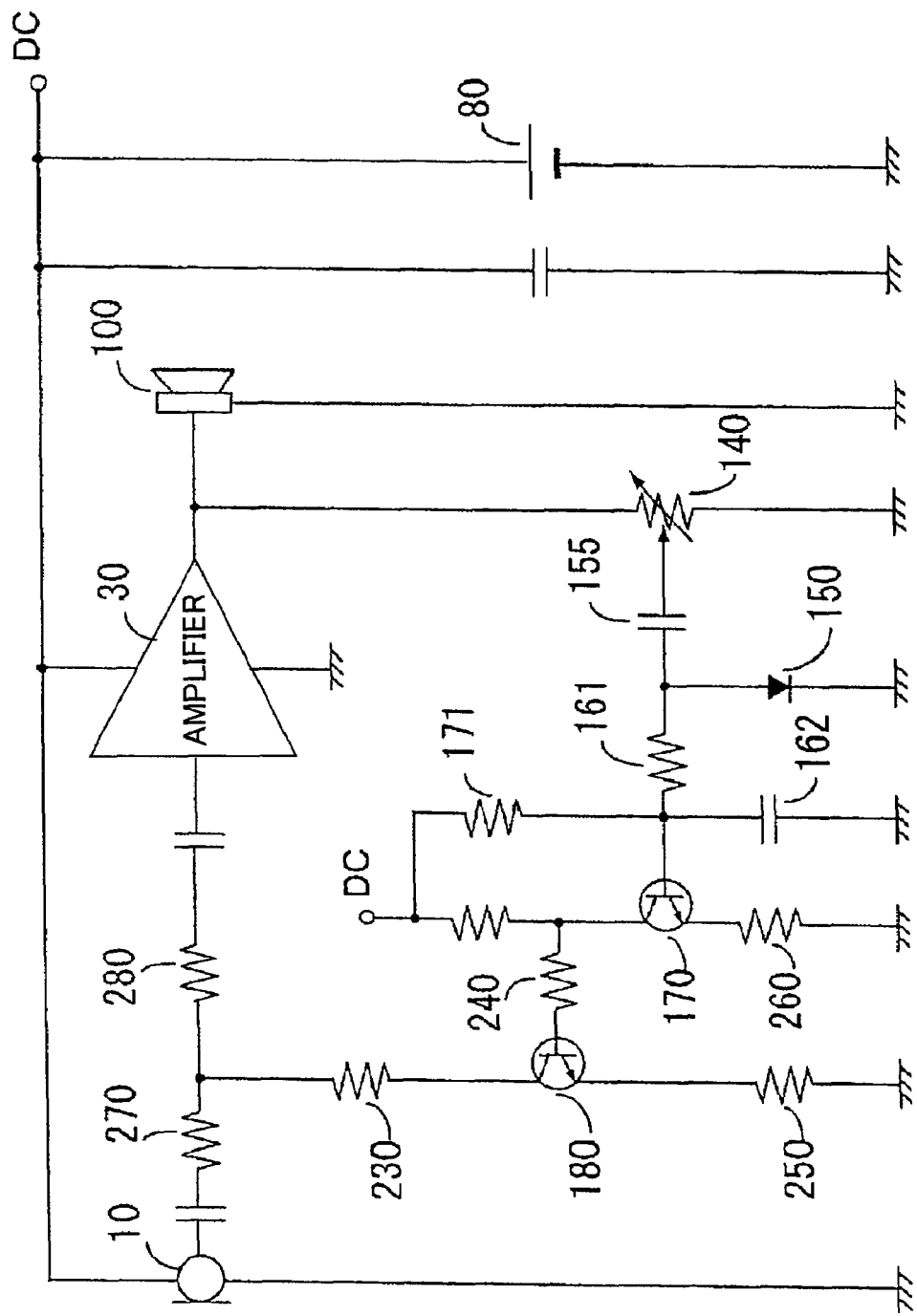
FIG. 3 is a circuit diagram of a conventional type hearing aid.

FIG. 2 is a circuit diagram showing an arrangement of a hearing aid in a second embodiment of the present invention. In the second embodiment, in contrast to the first embodiment, a charging circuit 90 (to be operated only when a power source 80 of the hearing aid is turned on) is added as shown in FIG. 2. The other arrangement is the same as that of the first embodiment, and detailed description is not given here. At the charging circuit 90, DC power is applied on the emitter of the transistor Q2. The base is grounded via the capacitor C8. Collector is connected to the connection point D, i.e. one end of the smoothing capacitor 53, via the resistance R6.

Now, description will be given on operation of the hearing aid with the arrangement as described above, referring to FIG. 2. In case of a circuit, which has no charging circuit 90, when the power 80 of the hearing aid is turned on with the automatic gain control function in operating status, pulsating current is generated due to the influence of initial charging to the smoothing capacitor 53. Therefore, the transistor 41 of the attenuation circuit 40 repeatedly turns on and off until the smoothing capacitor 53 is turned to the charging status, and a periodic burst sound may be outputted from the earphone 20.

In the second embodiment, there is provided the charging circuit 90. As a result, the smoothing capacitor 53 is turned to the charging status as soon as the power is connected, and the transistor 41 is turned to operating status. Then, if there is no input such as strong sound, the smoothing capacitor 53 is turned to the discharging status. This means that it is started from a mute status, and the burst sound as described above can be prevented.

In the first and the second embodiments, importance has been given on the battery service life based on the use of low current in the circuit to obtain high sound gain, and the earphone 20 with class D amplifier is used. However, the purpose of the invention can also be accomplished in the same manner when the earphone 20 is divided to an amplifier and an earphone with amplifier. In this case, the same effect can be achieved without the amplifying circuit 70 when the signal is taken from the output stage of the amplifier in the second stage. Description has been given above on an example where the amplifying circuit 70 comprises a current feedback bias circuit, while the same effect can be attained when other bias circuit or operational amplifier is used. Also, description has been given above on an example where the rectifying circuit 50 comprises a voltage doubler rectifying circuit, while the same effect can be attained by using other type of rectifying circuit.

INDUSTRIAL APPLICABILITY

In addition to the use in the hearing aid, the present invention is useful as an audio.device for automatically controlling the output when impact sound or excessive sound is inputted.

The invention claimed is:

1. A hearing aid with automatic excessive output sound control, the hearing aid comprising:
   an amplifier for amplifying an input signal from an input transducer;
   a rectifying circuit for rectifying an output signal of said amplifier;
   a smoothing capacitor for smoothening direct current rectified by said rectifying circuit;
   an attenuation circuit for attenuating the level of the output signal of said amplifier when a DC voltage smoothened by the smoothing capacitor exceeds a certain fixed level; and
   a charging circuit for charging said smoothing capacitor when power turns on, wherein
   said attenuation circuit comprises a first transistor, that turns on and draws the input signal of the amplifier when the DC voltage smoothened by said smoothing capacitor exceeds the certain fixed level.

2. The hearing aid with automatic excessive output sound control according to claim 1, further comprising:
   a second transistor to add bias to the base of said first transistor, wherein
   said first transistor and said second transistor have the same characteristics.

3. The hearing aid with automatic excessive output sound control according to claim 1, wherein said rectifying circuit comprises a plurality of diodes, and said rectifying circuit carries out a voltage doubler rectification.

4. A hearing aid with automatic excessive output sound control, the hearing aid comprising:
- an amplifier for amplifying an input signal from an input transducer;
- a rectifying circuit for rectifying an output signal of said amplifier;
- a smoothing capacitor for smoothing direct current rectified by said rectifying circuit; and
- an attenuation circuit for attenuating the level of the output signal of said amplifier when DC voltage smoothed by the smoothing capacitor exceeds a certain fixed level, wherein:
- said attenuation circuit comprises a variable resistance and a first transistor, the variable resistance determines a signal suppression amount applied to the input stage of the amplifier, and
- the first transistor turns on and draws the input signal of the amplifier when the DC voltage smoothened by said smoothing capacitor exceeds the certain fixed level.

5. The hearing aid with automatic excessive output sound control according to claim 4, further comprising a charging circuit for charging said smoothing capacitor when power turns on.

6. The hearing aid with automatic excessive output sound control according to claim 5, further comprising:
- a second transistor to add bias to the base of said first transistor, wherein
- said first transistor and said second transistor have the same characteristics.

7. The hearing aid with automatic excessive output sound control according to claim 4, wherein said rectifying circuit comprises a plurality of diodes, and said rectifying circuit carries out a voltage doubler rectification.

* * * * *